(12) United States Patent
Chen et al.

(10) Patent No.: US 9,703,159 B2
(45) Date of Patent: Jul. 11, 2017

(54) PIXEL STRUCTURE SUBSTRATE AND LIQUID CRYSTAL DISPLAY STRUCTURE USING THE SAME

(71) Applicant: INNOLUX CORPORATION, Chu-Nan, Miao-Li County (TW)

(72) Inventors: Chien-Hung Chen, Chu-Nan (TW); Pi-Ying Chuang, Chu-Nan (TW); Chuan-Chung Wang, Chu-Nan (TW); Yu-Wei Chen, Chu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 77 days.

(21) Appl. No.: 14/790,986

(22) Filed: Jul. 2, 2015

(65) Prior Publication Data
US 2015/0309378 A1    Oct. 29, 2015

Related U.S. Application Data
(63) Continuation of application No. 13/846,292, filed on Mar. 18, 2013, now Pat. No. 9,097,949.

(30) Foreign Application Priority Data
Apr. 12, 2012  (TW) .............................. 101113086 A

(51) Int. Cl.
G02F 1/1362    (2006.01)
H01L 27/12     (2006.01)
(Continued)

(52) U.S. Cl.
CPC .. *G02F 1/136213* (2013.01); *G02F 1/133345* (2013.01); *G02F 1/134363* (2013.01);
(Continued)

(58) Field of Classification Search
None
See application file for complete search history.

(56) References Cited

U.S. PATENT DOCUMENTS 7,538,827 B2*  5/2009  Chou ............... G02F 1/136213
                                                    349/32
7,781,272 B2*  8/2010  Li .................. G02F 1/136213
                                                    438/149
(Continued)

FOREIGN PATENT DOCUMENTS

| TW | 200717081 | 5/2007 |
| TW | 200734735 | 9/2007 |
| TW | 201202811 | 1/2012 |

OTHER PUBLICATIONS

Foreign Office Action issued by the Taiwan Intellectual Property Office, dated Aug. 20, 2014.

*Primary Examiner* — Ryan Crockett
(74) *Attorney, Agent, or Firm* — Liu & Liu

(57) ABSTRACT

A pixel structure substrate including a substrate, a first dielectric layer and a second dielectric layer is provided. A data line and a first electrode are disposed on the substrate. The first dielectric layer directly covers the data line. The second dielectric layer covers the first electrode and the first dielectric layer. A thickness of the second dielectric layer is smaller than a thickness of the first dielectric layer, and the following equation is satisfied $$u1*A1/d1 < u2*A2/d2,$$

wherein A1 denotes an area of the first dielectric layer overlapping the data line, d1 denotes the thickness of the first dielectric layer and u1 denotes a permittivity of the first dielectric layer, A2 denotes an area of the second dielectric layer overlapping the pixel electrode, d2 denotes the thick-
(Continued)

ness of the second dielectric layer and u2 denotes a permittivity of the second dielectric layer.

20 Claims, 19 Drawing Sheets

(51) Int. Cl.
*G02F 1/1333* (2006.01)
*G02F 1/1343* (2006.01)

(52) U.S. Cl.
CPC ........ *H01L 27/124* (2013.01); *H01L 27/1248* (2013.01); *G02F 2202/42* (2013.01)

(56) References Cited

U.S. PATENT DOCUMENTS

| | | | | |
|---|---|---|---|---|
| 8,575,612 | B2* | 11/2013 | Lee | H01L 27/1255 257/59 |
| 2007/0091248 | A1* | 4/2007 | Yan | G02F 1/13394 349/156 |
| 2008/0129902 | A1* | 6/2008 | Qi | G02F 1/133345 349/33 |
| 2010/0053490 | A1* | 3/2010 | Kang | G02F 1/133371 349/48 |
| 2012/0248443 | A1* | 10/2012 | Katsui | G02F 1/1368 257/57 |
| 2013/0320337 | A1* | 12/2013 | Yamazaki | H01L 27/1225 257/43 |
| 2016/0372497 | A1* | 12/2016 | Lee | H01L 27/1255 |

* cited by examiner

US 9,703,159 B2

PIXEL STRUCTURE SUBSTRATE AND LIQUID CRYSTAL DISPLAY STRUCTURE USING THE SAME

This application is a continuation application of co-pending U.S. application Ser. No. 13/846,292, filed Mar. 18, 2013, which is allowed for issuance as a patent. This application claims the benefit of Taiwan application Serial No. 101113086, filed Apr. 12, 2012, the subject matter of which is incorporated herein by reference.

BACKGROUND OF THE INVENTION

Field of the Invention

The invention relates in general to a liquid crystal display, and more particularly to a pixel structure and a liquid crystal display structure using the same.

Description of the Related Art

Having the features of low voltage operation, no radiation, light weight and small size, the liquid crystal display (LCD) has gradually replaced the conventional cathode ray tube (CRT) display and become a mainstream product in the display market.

However, the liquid crystal display still encounters some problems such as the viewing angle being too narrow and the liquid crystal response time being too long. Therefore, how to enlarge the viewing angle and shorten the response time are prominent tasks for the industries. Currently, several solutions for wide-viewing angle LCD such as multi-domain vertical alignment (MVA) LCD, in-plane switching (IPS) LCD and fringe field switching (FFS) LCD are already provided. In general, once the response speed of the liquid crystal is not fast enough, streaking will occur. That is, when displaying fast moving animation, the movement will be delayed and the images and texts are hard to recognize. Related studies show that the pictures in motion will be delayed when the response time of the liquid crystal is over 40 ms. Currently, most standards of response time for the LCD panel are around 25 ms, and the blue phase liquid crystal (BPLC) technology with shorter response time has become more and more popular.

The blue phase liquid crystal can only exist within a narrow temperature range. A solution is provided to enlarge the temperature range by adding monomers of polymer to the blue phase cholesterol liquid crystal, further radiating the cholesterol liquid crystal with a UV light at the blue phase transition temperature and polymerizing the liquid crystal to stabilize the blue phase lattice structure. However, no matter the blue phase lattice is stabilized by way of polymerization or not, the obtained photoelectric curve (V-T curve) of the liquid crystal layer always shows hysteresis, and the repetitive operability of the BPLC display is not satisfactory.

SUMMARY OF THE INVENTION

The invention is directed to a pixel structure and a liquid crystal display structure using the same capable of reducing hysteresis and enhancing repetitive operability.

According to an embodiment of the present invention, a pixel structure including a substrate, a first dielectric layer and a second dielectric layer is provided. A signal line and a pixel electrode are disposed on the substrate. The first dielectric layer covers the signal line and has a first capacitance. The second dielectric layer is disposed on the substrate, and covers the pixel electrode. The second dielectric layer has a second capacitance larger than the first capacitance.

According to another embodiment of the present invention, a liquid crystal display structure including a substrate, a first dielectric layer, a second dielectric layer, an opposite substrate and a liquid crystal layer is provided. A signal line and a pixel electrode are disposed on the substrate. The first dielectric layer covers the signal line and has a first capacitance. The second dielectric layer is disposed on the substrate, and covers the pixel electrode. The second dielectric layer has a second capacitance larger than the first capacitance. The opposite substrate is opposite and parallel to the substrate. The liquid crystal layer is disposed between the substrate and the opposite substrate.

The above and other aspects of the invention will become better understood with regard to the following detailed description of the preferred but non-limiting embodiment(s). The following description is made with reference to the accompanying drawings.

DETAILED DESCRIPTION OF THE INVENTION

According to the pixel structure and the liquid crystal display structure using the same disclosed in the invention, a dielectric layer, formed by organic or inorganic substance, covers the substrate, the pixel electrode and the common electrode during the growth of lattice. The liquid crystal layer and the dielectric layer directly contact, and a mixture of blue phase cholesterol liquid crystal and monomers is heated to the temperature range within which blue phase lattice exists. Then, a period of time is allowed for the lattice of the blue phase liquid crystal to achieve stable growth. Then, the liquid crystal layer is irradiated with a UV light and polymerized to form a polymer-stabilized blue phase (PSBP) liquid crystal layer. In the invention, the liquid crystal layer grows lattice on the same dielectric surface (the dielectric layer). When lattice is grown on different dielectric surfaces (the substrate and the electrode layer) with different temperature or interface conditions, the lattice cannot be uniformly grown. Since the liquid crystal layer has blue phase liquid crystal with stable lattice growth, photoelectric properties of the liquid crystal layer are thus improved, hysteresis is reduced and repetitive operability is enhanced. Recently, it is an inevitable trend for the industries to adopt the liquid crystal layer with shorter response time. The liquid crystal layer is optically isotropic when no electric field is generated thereon and is optically anisotropic when an electric field is generated thereon. The liquid crystal layer is exemplified by a blue phase liquid crystal.

Figure 1:
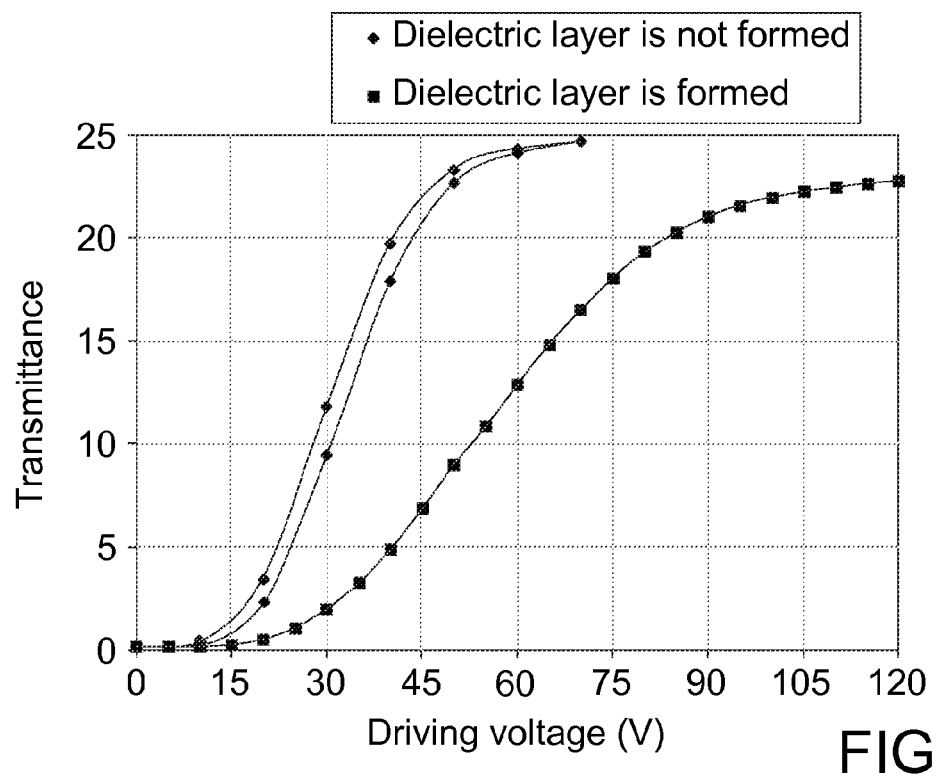
FIG. 1 shows a comparison of photoelectric curves between a liquid crystal layer not formed on a dielectric layer and a liquid crystal layer formed on a dielectric layer.

Referring to FIG. 1, a comparison of photoelectric curves between a liquid crystal layer not formed on a dielectric layer and a liquid crystal layer formed on a dielectric layer is shown. Experimental results show that hysteresis does not occur to the photoelectric curve of the liquid crystal layer formed on the dielectric layer but occurs to the photoelectric curve of the liquid crystal layer not formed on the dielectric layer. Therefore, the invention really improves photoelectric properties of the liquid crystal layer.

A number of embodiments are disclosed below for elaborating the invention. However, the embodiments of the invention are for detailed descriptions only, not for limiting the scope of protection of the invention.

Figure 2A:
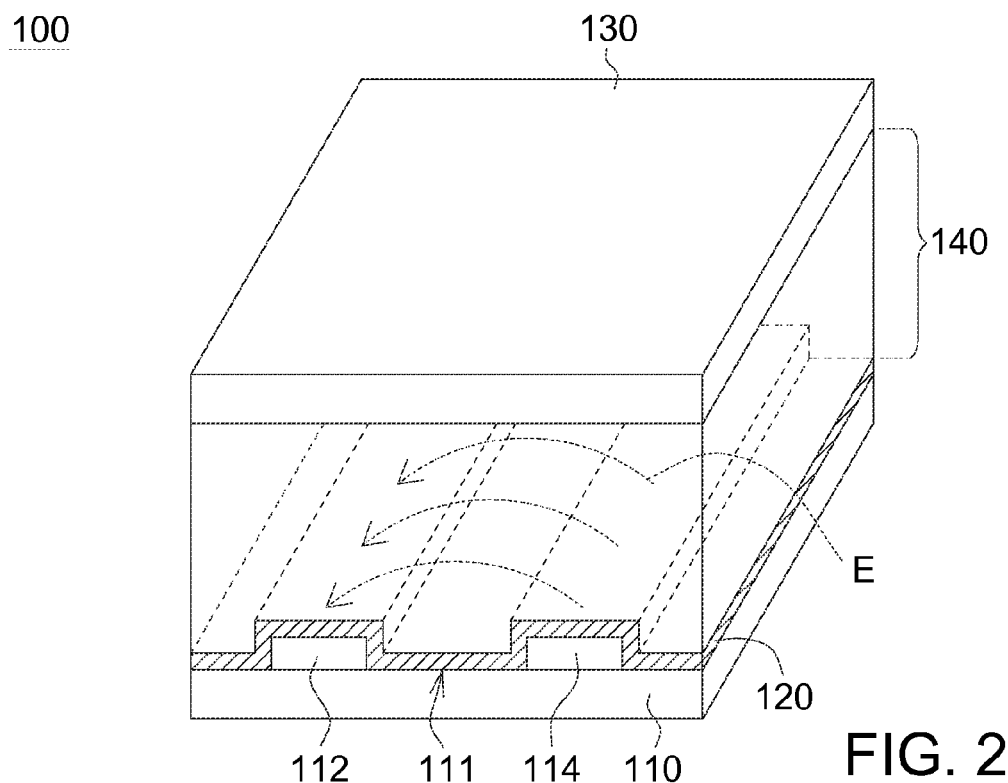
FIG. 2A shows a partial diagram of a liquid crystal display structure according to an embodiment of the invention.

Referring to FIG. 2A, a partial diagram of a liquid crystal display structure according to an embodiment of the invention is shown. The liquid crystal display structure 100 includes a substrate 110, a dielectric layer 120, an opposite substrate 130 and a liquid crystal layer 140. The substrate 110 and the opposite substrate 130 are parallel and opposite to each other, and may be an active element array substrate and a color filter substrate respectively, for example. The active element array substrate may be a thin film transistor (TFT) array substrate or a diode array substrate. The liquid crystal layer 140 is disposed between the substrate 110 and the opposite substrate 130, and may be a polymer-stabilized blue phase (PSBP) liquid crystal layer, for example. Typically, the blue phase liquid crystal has three phases, namely, the first blue phase (BP I), the second blue phase (BP II) and the third blue phase (BP III). The first blue phase liquid crystal and the second blue phase liquid crystal form a double twist cylinder (DTC) structure, that is, liquid crystal twists along two direction to form double twist cylinders and each cylinder is perpendicular to nearby one. The first blue phase liquid crystal is a body-centered cubic (BCC) structure, the second blue phase liquid crystal is a simple cubic (SC) structure, and the third blue phase liquid crystal is amorphous. When no lateral electric field E is generated on the positive type blue phase liquid crystal, ideally the positive blue phase liquid crystal is optical isotropic and has no birefringence (that is, $\Delta n=0$), free of phase delay, impermeable to the light to presents a normally black state. When a lateral electric field E is generated on the positive type blue phase liquid crystal, the blue phase liquid crystal is optical anisotropic, generates birefringence (that is, $\Delta n>0$) which causes phase delay, to presents a bright state when operated under a normally black mode.

Referring to FIG. 2A. A first electrode 112 and a second electrode 114 are parallel to each other and disposed on the substrate 110, and a voltage is applied to the first electrode 112 and the second electrode 114 to generate a lateral electric field E between the first electrode 112 and the second electrode 114. In the present embodiment, the first electrode 112 is a pixel electrode with low potential, and the second electrode 114 is a common electrode with high potential, such that a lateral electric field E is generated between the first electrode 112 and the second electrode 114 due to potential difference. The lateral electric field E, such as an IPS lateral electric field, controls the birefringence of the liquid crystal layer 140 such that the light may penetrate the liquid crystal layer 140 to present a bright state.

Besides, the dielectric layer 120 is a film disposed on the substrate 110 by way of evaporation, sputtering, physical vapor deposition (PVD), chemical vapor deposition (CVD), atomic layer deposition (ALD) or metal organic chemical vapor deposition (MOCVD). The dielectric layer 120 may be formed by inorganic substance such as a silicide (such as SiOx and SiNx), an oxide (such as $Al_2O_3$, $TiO_2$, $TaO_5$, $SrTiO_3$, $ZrO_2$, $HfO_2$, $HfSiO_4$, $La_2O_3$, $YaO_3$, a-$LaAlO_3$) etc. or an organic polymer (such as polyimide resin and polyamide resin). The atomic layer deposition method precisely controls film thickness to atomic level (about 1/10 of nanometer, and a nanometer is equal to 10 angstroms). During the growth of lattice, as the substrate 110 and the electrodes 112 and 114 are disposed under the dielectric layer 120 and cannot affect the crystal of the liquid crystal layer 140, the liquid crystal layer 140 with stable lattice growth can thus be formed.

Figure 2B:
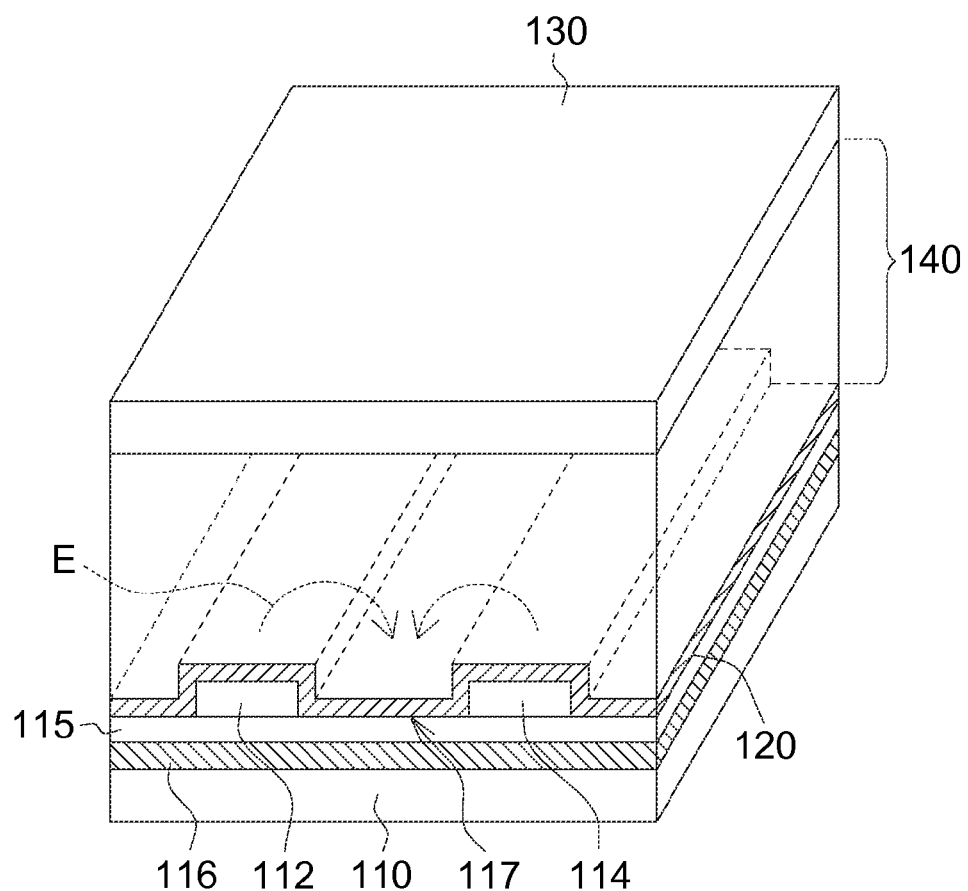
FIG. 2B shows a partial diagram of a liquid crystal display structure according to another embodiment of the invention.

Referring to FIG. 2B, a partial diagram of a liquid crystal display structure 101 according to another embodiment of the invention is shown. In the present embodiment, a third electrode 116 is disposed on the substrate 110 and under the first electrode 112 and the second electrode 114. The third electrode 116 is further separated from the first electrode 112 and the second electrode 114 by an insulation layer 115. The first electrode 112 and the second electrode 114 may be pixel electrodes with high electric potentials, and the third electrode 116 may be a common electrode with low electric potential, such that a lateral electric field E, such as a fringe field switching (FFS) lateral electric field, is generated respectively between the third electrode 116 and the first electrode 112 and between the third electrode 116 and the second electrode 114 due to due to potential difference. The lateral electric field E controls the birefringence of the liquid crystal layer 140 such that the light may penetrate the liquid crystal layer 140 to present a bright state.

Based on the liquid crystal display structure 100 disclosed above, the present embodiment provides a pixel structure. Firstly, a first electrode 112 and a second electrode 114 are parallel to each other and disposed on a substrate 110. Next, a dielectric layer 120 is formed on the substrate 110, wherein the dielectric layer 120 covers the first electrode 112, the second electrode 114, and the substrate surface 111 (or the insulation layer 117) located between the first electrode 112 and the second electrode 114. Then, a liquid crystal layer 140 is formed between the substrate 110 and an opposite substrate 130. Then, the liquid crystal layer 140 is heated to the temperature range within which blue phase lattice exists, a period of time is allowed for the lattice to achieve stable growth in the liquid crystal layer 140, and the liquid crystal layer 140 is irradiated with a UV light to form polymerization.

Figure 3:
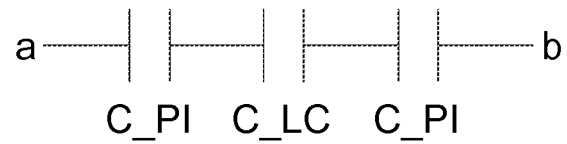
FIG. 3 shows a schematic diagram of an equivalent capacitance of the liquid crystal display structure of FIG. 2A.
Figure 4A:
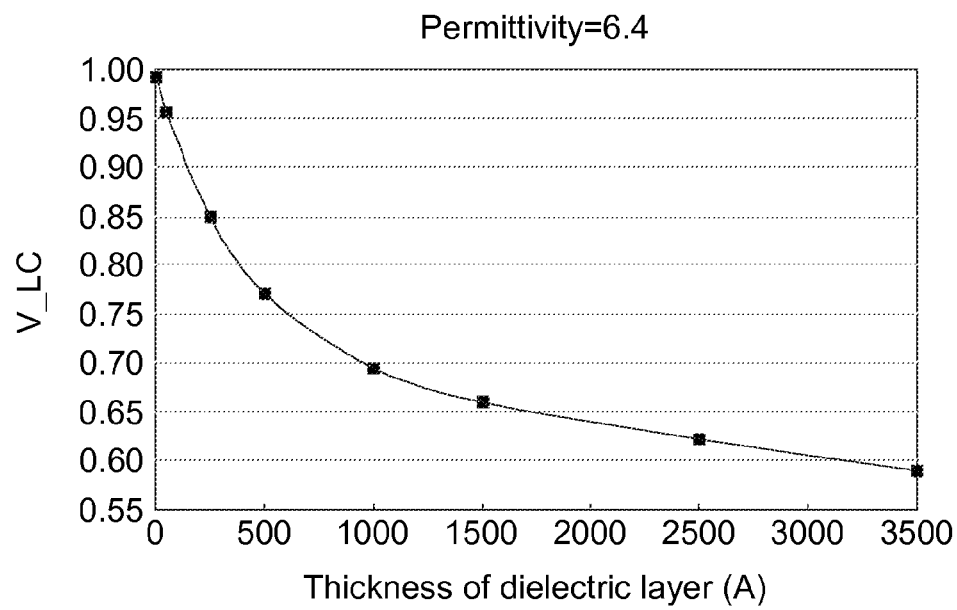
FIGS. 4A~4D are respective curve charts showing dielectric layer's thickness (X) vs. driving voltage percentage (V_LC) relationship satisfying formula (2)
Figure 4B:
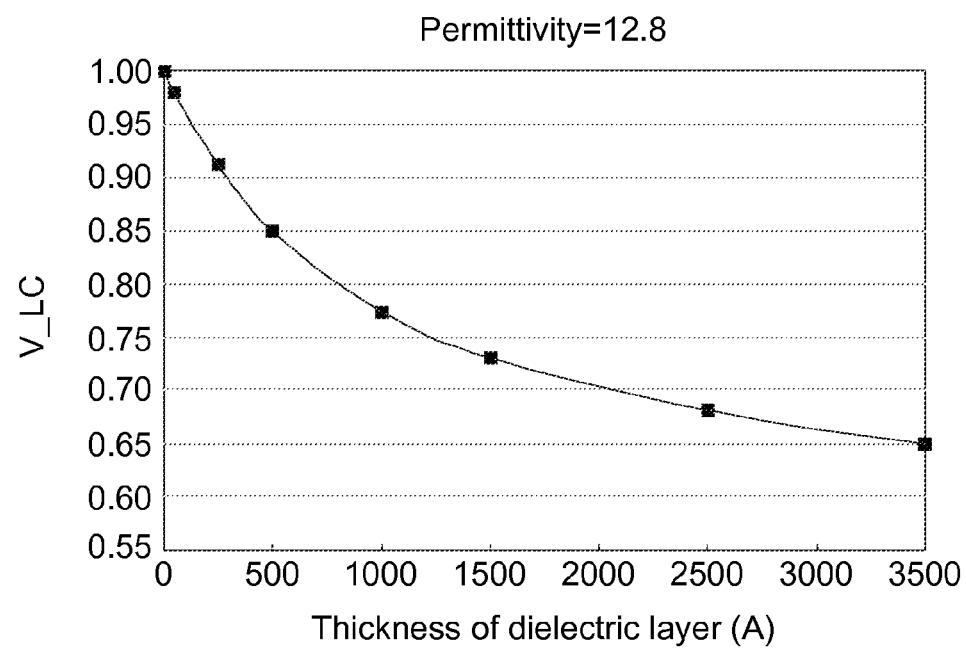
Figure 4C:
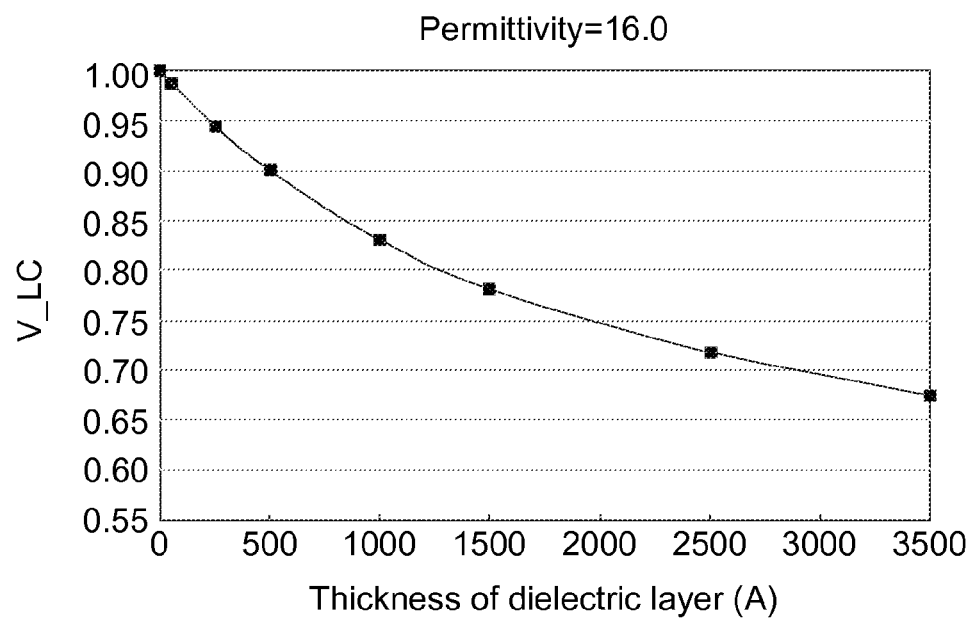
Figure 4D:
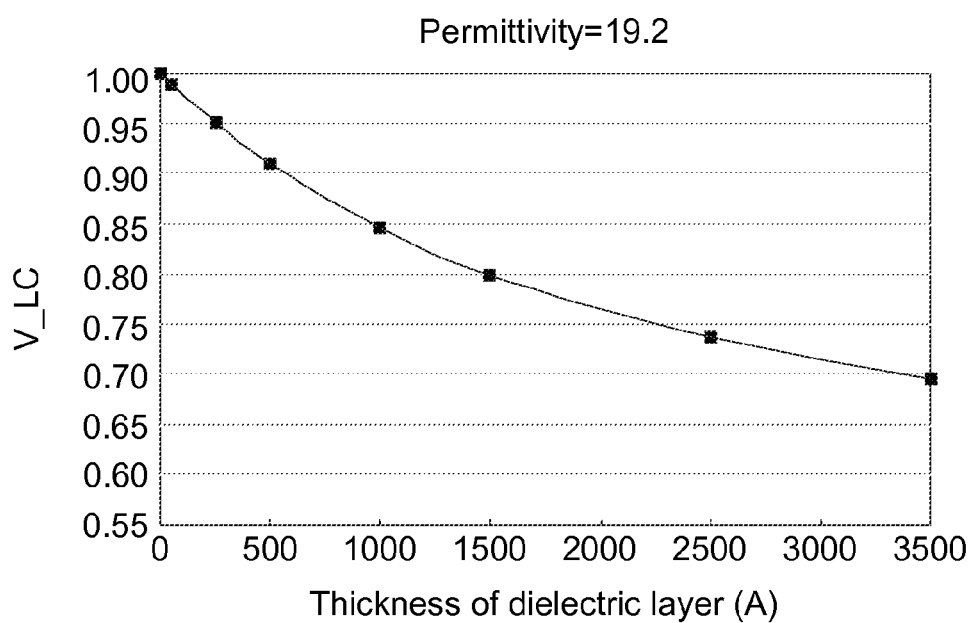
Figure 5A:
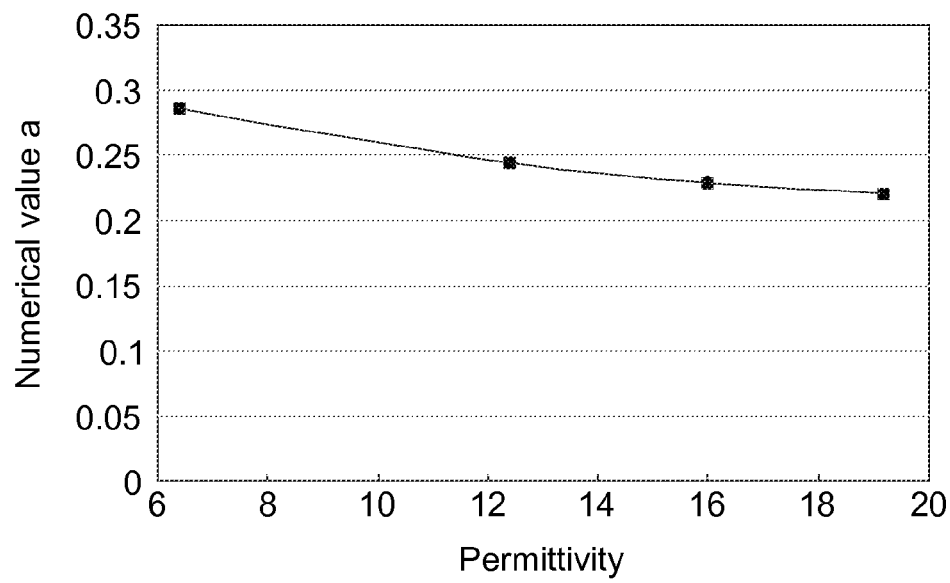
FIGS. 5A~5D are respective curve charts showing numerical value (Y=a, b, c or d) vs. dielectric layer's permittivity (S) relationship satisfying formula (3)
Figure 5B:
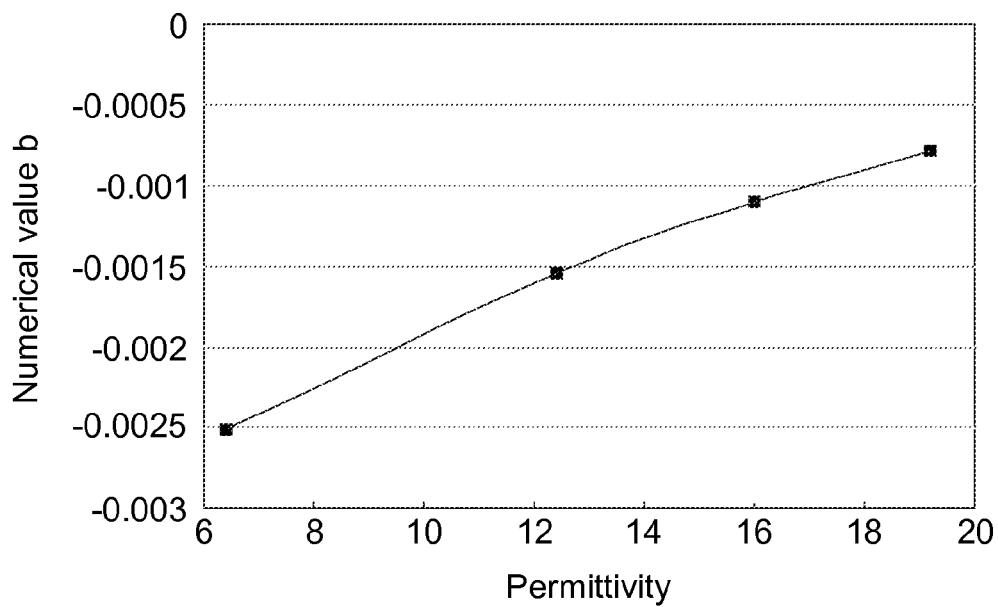
Figure 5C:
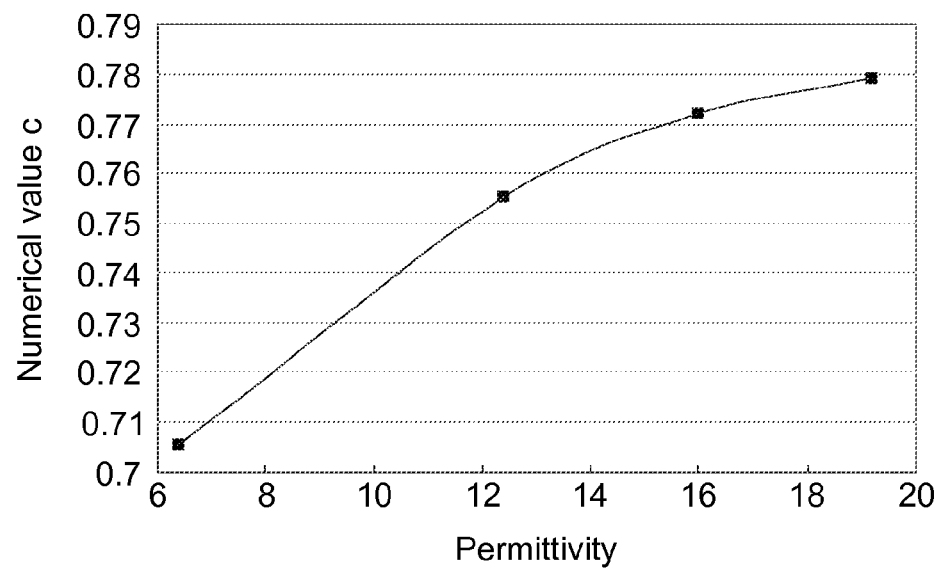
Figure 5D:
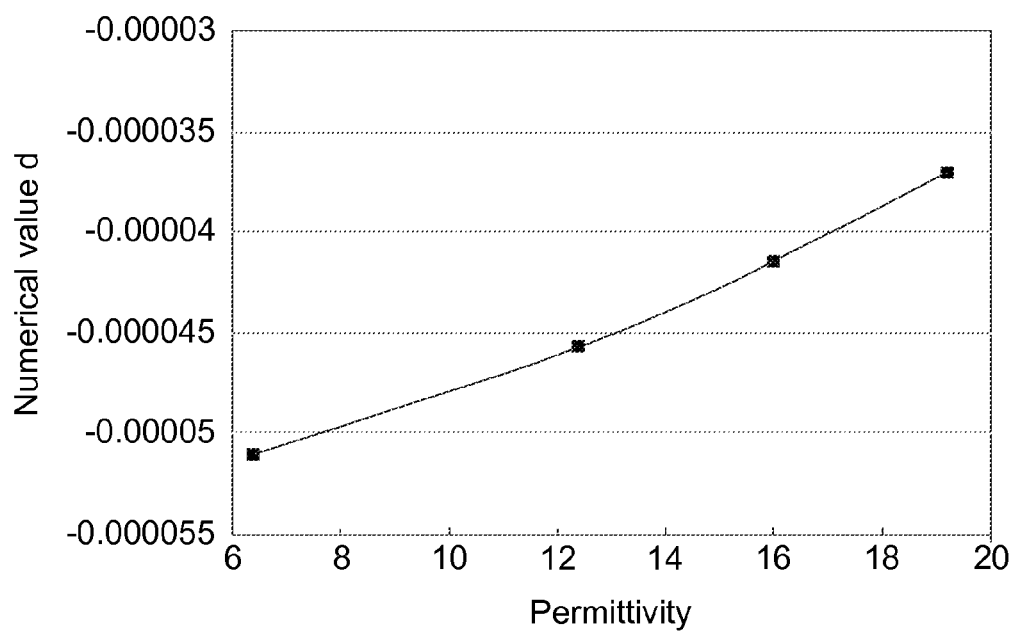

Referring to FIG. 3, a schematic diagram of an equivalent capacitance of the liquid crystal display structure 100 of FIG. 2A is shown. C_LC denotes an equivalent capacitance of the lateral electric field E passing through the liquid crystal layer 140. C_PI denotes an equivalent capacitance between the liquid crystal layer 140 and the first electrode 112 and an equivalent capacitance between the liquid crystal layer 140 and the second electrode 114 respectively. When a voltage is applied between the ends a and b, the driving voltage generated by the lateral electric field E through the liquid crystal layer 140 is denoted by V_LC, the applied voltage is denoted by Vab, the ratio of the driving voltage (V_LC) to the voltage (Vab) is expressed in percentage as formula (1):

$$\frac{V\_LC}{Vab} \approx \left( \frac{\frac{1}{C\_LC}}{\frac{1}{C\_LC} + \frac{2}{C\_PI}} \right) \times 100\% \quad (1)$$

In formula (1), the numerical values of equivalent capacitances C_LC and C_PI are associated with the thickness and permittivity of the dielectric layer 120. Provided that the permittivity of the dielectric layer 120 is known, optimal combinations of the thickness of the dielectric layer 120 and the driving voltage of the liquid crystal layer 140 are obtained through simulation experiments. The permittivity of the dielectric layer 120 is dependent on the characteristics of the material, and may range between 6~60, but the invention is not limited thereto. In the present embodiment, the permittivity is exemplified by some typical values such as 6.4, 12.8, 16.0, 19.2 and 60, and any permittivity between 6~60 can be obtained by way of interpolation or formula approximation, and the similarities and details are not repeated here.

Referring to Table 1, the simulation results of the combinations of the thickness of the dielectric layer and the driving voltage (V_LC) of the liquid crystal layer with the permittivity of the dielectric layer being equal to 6.4 are shown. When the thickness of the dielectric layer is larger than 3000 angstroms, the ratio of the driving voltage of the liquid crystal layer to the applied voltage expressed in percentage (the driving voltage percentage) is less than 60%. That is, to maintain the same driving voltage, the operating voltage between end a and end b needs to be increased. In addition, to reduce the magnitude of voltage drop, the thickness of the dielectric layer is reduced such that the ratio of the driving voltage of the liquid crystal layer to the applied voltage expressed in percentage is increased. For example, when the thickness is less than 1000 angstroms, the driving voltage percentage may be increased to be over 70%.

TABLE 1

| Thickness | Permittivity | C_LC | C_PI | V_LC (%) |
|---|---|---|---|---|
| — | — | 1.22E−12 | — | 100.00% |
| 50 Å | 6.4 | 1.16E−12 | 4.64E−11 | 95.23% |
| 250 Å | 6.4 | 9.68E−13 | 9.29E−12 | 82.75% |
| 500 Å | 6.4 | 9.05E−13 | 6.96E−12 | 79.36% |
| 1000 Å | 6.4 | 6.87E−13 | 3.14E−12 | 69.55% |
| 1500 Å | 6.4 | 5.75E−13 | 2.17E−12 | 65.37% |
| 2500 Å | 6.4 | 4.66E−13 | 1.50E−12 | 61.76% |
| 3500 Å | 6.4 | 3.86E−13 | 1.13E−12 | 59.36% |

Referring to Table 2, the simulation results of the combinations of the thickness of the dielectric layer and the driving voltage (V_LC) of the liquid crystal layer with the permittivity of the dielectric layer being equal to 12.8 are shown. When the thickness of the dielectric layer is less than 2000 angstroms, the ratio of the driving voltage of the liquid crystal layer to the applied voltage expressed in percentage may also be increased to be over 70% (obtained by way of interpolation). In comparison to Table 1, for the dielectric layers with the same thickness, the increase in permittivity helps to increase the driving voltage percentage to reduce the magnitude of voltage drop accordingly.

TABLE 2

| Thickness | Permittivity | C_LC | C_PI | V_LC (%) |
|---|---|---|---|---|
| — | — | 1.22E−12 | — | 100.00% |
| 50 Å | 12.8 | 1.21E−12 | 2.00E−10 | 98.80% |
| 250 Å | 12.8 | 1.07E−12 | 1.73E−11 | 88.99% |
| 500 Å | 12.8 | 1.03E−12 | 1.32E−11 | 86.49% |
| 1500 Å | 12.8 | 7.66E−13 | 4.09E−12 | 72.78% |
| 2500 Å | 12.8 | 6.50E−13 | 2.78E−12 | 68.10% |
| 3500 Å | 12.8 | 5.65E−13 | 2.10E−12 | 65.02% |

Referring to Table 3, the simulation results of the combinations of the thickness of the dielectric layer and the driving voltage (V_LC) of the liquid crystal layer with the permittivity of the dielectric layer being equal to 16 are shown. When the thickness of the dielectric layer is less than 2500 angstroms, the ratio of the driving voltage of the liquid crystal layer to the applied voltage expressed in percentage may also be increased to be over 70%. In comparison to Table 1, for the dielectric layers with the same thickness, the increase in permittivity helps to increase the driving voltage percentage to reduce the magnitude of voltage drop accordingly.

TABLE 3

| Thickness | Permittivity | C_LC | C_PI | V_LC (%) |
|---|---|---|---|---|
| — | — | 1.22E−12 | — | 100.00% |
| 50 Å | 16.0 | 1.22E−12 | — | 100.00% |
| 250 Å | 16.0 | 1.11E−12 | 2.50E−11 | 91.81% |
| 500 Å | 16.0 | 1.10E−12 | 2.23E−11 | 91.00% |
| 1500 Å | 16.0 | 8.47E−13 | 5.51E−12 | 76.49% |
| 2500 Å | 16.0 | 7.35E−13 | 3.68E−12 | 71.47% |
| 3500 Å | 16.0 | 6.41E−13 | 2.69E−12 | 67.76% |

Referring to Table 4, the simulation results of the combinations of the thickness of the dielectric layer and the driving voltage (V_LC) of the liquid crystal layer with the permittivity of the dielectric layer being equal to 19.2 are shown. When the thickness of the dielectric layer is less than 3500 angstroms, the ratio of the driving voltage of the liquid crystal layer to the applied voltage expressed in percentage may also be increased to be over 70%. In comparison to Table 1, for the dielectric layers with the same thickness, the increase in permittivity helps to increase the driving voltage percentage to reduce the magnitude of voltage drop accordingly.

TABLE 4

| Thickness | Permittivity | C_LC | C_PI | V_LC (%) |
|---|---|---|---|---|
| — | — | 1.22E−12 | — | 100.00% |
| 50 Å | 19.2 | 1.22E−12 | — | 100.00% |
| 250 Å | 19.2 | 1.14E−12 | 3.23E−11 | 93.42% |
| 500 Å | 19.2 | 1.13E−12 | 2.95E−11 | 92.89% |
| 1500 Å | 19.2 | 8.77E−13 | 6.20E−12 | 77.96% |
| 2500 Å | 19.2 | 7.77E−13 | 4.26E−12 | 73.27% |
| 3500 Å | 19.2 | 7.07E−13 | 3.35E−12 | 70.32% |

Referring to Table 5, the simulation results of the combinations of the thickness of the dielectric layer and the driving voltage (V_LC) of the liquid crystal layer with the permittivity of the dielectric layer being equal to 60 are shown. When the thickness of the dielectric layer is less than 3500 angstroms, the ratio of the driving voltage of the liquid crystal layer to the applied voltage expressed in percentage is still over 88%. When thickness is less than 500 angstroms, the ratio of the driving voltage of the liquid crystal layer to the applied voltage expressed in percentage still may reach 100%. The driving voltage percentage decreases along with the increase in the thickness of the dielectric layer.

TABLE 5

| Thickness (PI) | Permittivity | C_LC | C_PI | V_LC (%) |
|---|---|---|---|---|
| — | — | 1.22E−12 | — | 100.00% |
| 50 Å | 60.0 | 1.22E−12 | | 100.00% |
| 250 Å | 60.0 | 1.11E−12 | 2.50E−11 | 100.00% |
| 500 Å | 60.0 | 1.10E−12 | 2.23E−11 | 100.00% |
| 1500 Å | 60.0 | 8.47E−13 | 5.51E−12 | 95.20% |
| 2500 Å | 60.0 | 7.35E−13 | 3.68E−12 | 90.64% |
| 3500 Å | 60.0 | 6.41E−13 | 2.69E−12 | 88.17% |

Referring to FIGS. 4A~4D, respective curve charts showing dielectric layer thickness (X) vs. driving voltage percentage (V_LC) relationship satisfying formula (2) are shown. The relationship of dielectric layer thickness (X) vs. driving voltage percentage (V_LC) is expressed in formula (2) as follows:

$$V\_LC = a*\mathrm{Exp}(b*X) + c*\mathrm{Exp}(d*X) \quad (2)$$

Wherein the parameters a, b, c and d may be obtained by looking up the table or from the curve charts of FIGS. 5A~5D. Referring to Table 6, numerical values of parameters a, b, c and d with the permittivity of the dielectric layer being equal to 6.4, 12.8, 16.0, and 19.2 are shown. FIGS. 4A~4D show that when the permittivity of the dielectric layer is a constant, the driving voltage percentage decreases along with the increase in the thickness of the dielectric layer.

TABLE 6

| Permittivity | a | b | c | d |
|---|---|---|---|---|
| 6.4 | 0.2861 | −0.002489 | 0.7052 | −0.00005106 |
| 12.8 | 0.2412 | −0.001630 | 0.7592 | −0.00004513 |
| 16.0 | 0.23 | −0.000915 | 0.77 | −0.00004157 |
| 19.2 | 0.22 | −0.00085 | 0.78 | −0.000037 |

Referring to FIGS. 5A~5D, respective curve charts showing numerical value (Y=a, b, c or d) vs. dielectric layer permittivity (S) relationship satisfying formula (3) are shown. The relationship of respective numerical values (Y=a, b, c or d) vs. dielectric layer permittivity (S) is expressed in formula (3) as follows:

$$Y = P1*S^2 + P2*S + P3 \quad (3)$$

Wherein the numerical values of parameters P1, P2 and P3 may be obtained by looking up the table or by regression analysis with the variables (Y) and (S) in formula (3) being substituted with given values, and the results are illustrated in Table 7.

TABLE 7

| | P1 | P2 | P3 |
|---|---|---|---|
| a | 2.683e−04 | −1.198e−02 | 3.516e−01 |
| b | −3.762e−06 | 2.315e−04 | −3.84e−03 |
| c | −3.72e−04 | 1.528e−02 | 6.229e−01 |
| d | 2.89e−08 | 3.534e−07 | −5.449e−05 |

Figure 6:
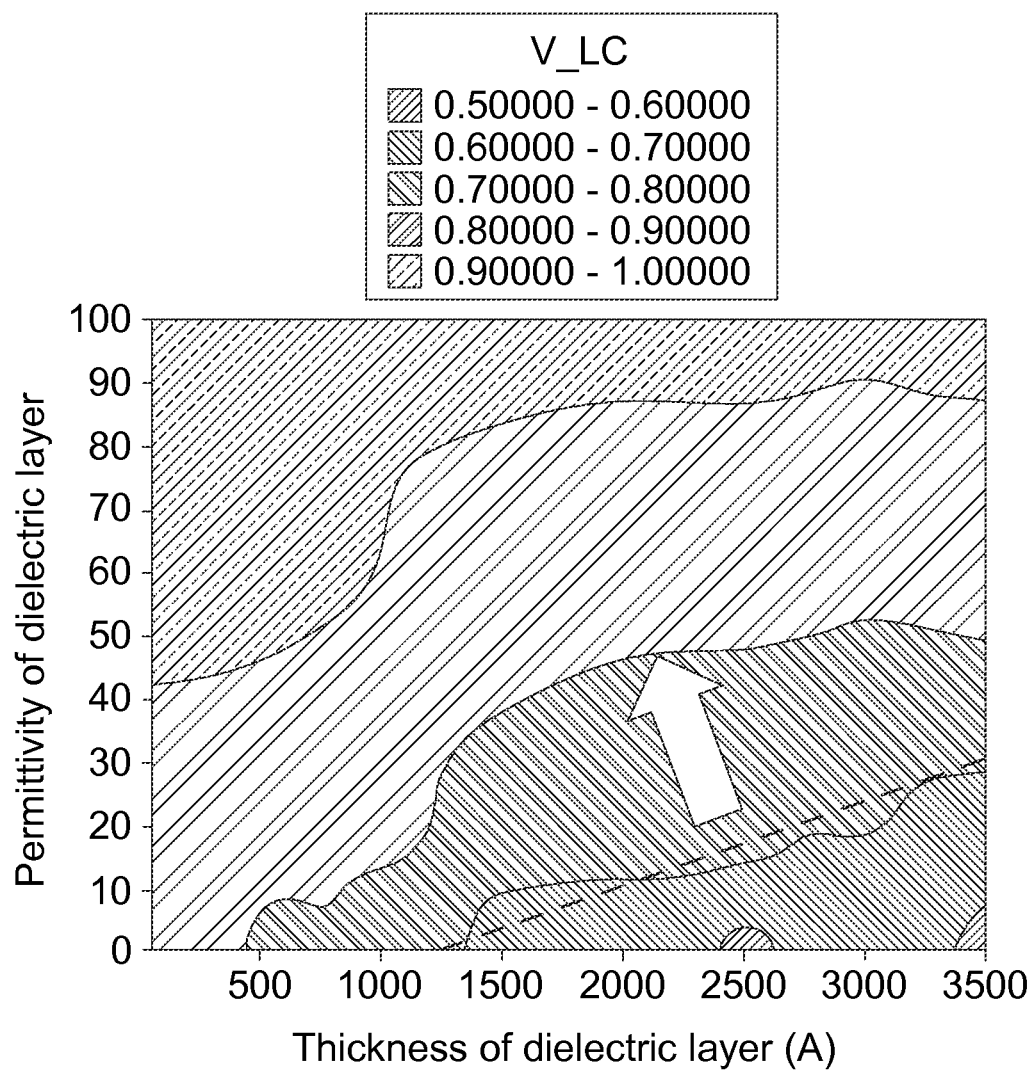
FIG. 6 shows a distribution chart of driving voltage percentage (V_LC) expressed in a coordinate system of thickness (X) and permittivity (S) of the dielectric layer.

In addition, formulas (2) and (3) show that the driving voltage percentage (V_LC) is associated with the dielectric layer thickness (X) and the dielectric layer permittivity (S). Referring to FIG. 6, a distribution chart of driving voltage percentage (V_LC) expressed in a coordinate system of thickness (X) and permittivity (S) of the dielectric layer is shown. In the 2D coordinate system of FIG. 6, the dotted line assumes that the ratio of the driving voltage (V_LC) of the liquid crystal layer to the applied voltage expresses in percentage is about 70%, and the arrow denotes an ideal region when the driving voltage (V_LC) is more than 70% of the applied voltage. The region corresponding to the driving voltage of the dielectric layer being used can be easily located for determining whether the driving voltage percentage fits the needs.

In the above disclosure, a dielectric layer is entirely formed on the substrate. That is, the dielectric layer not only covers the electrode within the pixel region but also covers the scan line and the data line within the non-pixel region. As the permittivity of the dielectric layer is large, a large capacitance is generated and makes the scan line and the data line overloaded. In the following embodiments, the dielectric layer with smaller capacitance is formed on the non-pixel region of the substrate to reduce the loading received by the scan line and data line, and the dielectric layer with larger capacitance is formed on the pixel region of the substrate such that the ratio of the driving voltage (V_LC) of the liquid crystal layer to the applied voltage expresses in percentage fits the needs. As a result, voltage drop is avoided.

Referring to Table 8 and Table 9, two relationships of permittivity vs. thickness of the dielectric layer are shown. The capacitance formula shows that capacitance C=permittivity*A/d, wherein A denotes area and d denotes thickness. When the permittivity gets smaller or the thickness (d) gets larger, the capacitance (C) decreases. Conversely, when the permittivity gets larger or the thickness (d) gets smaller, the capacitance (C) increases. Based on the numerical values illustrated below, an appropriate dielectric layer satisfying the requirement that the capacitance of the second dielectric layer is larger than the capacitance of the first dielectric layer can thus be selected regardless of the magnitudes of permittivity and thickness.

TABLE 8

| Case 1 | Permittivity | Thickness (d) | Capacitance (C) |
|---|---|---|---|
| First Dielectric Layer | 6 | 3000 Å | 0.002 |
| Second Dielectric Layer | 10 | 2000 Å | 0.005 |
| First Dielectric Layer | 12 | 6000 Å | 0.002 |
| Second Dielectric Layer | 10 | 2000 Å | 0.005 |
| First Dielectric Layer | 6 | 3000 Å | 0.002 |
| Second Dielectric Layer | 20 | 4000 Å | 0.005 |

TABLE 9

| Case 2 | Permittivity | Thickness (d) | Capacitance (C) |
|---|---|---|---|
| First Dielectric Layer | 6 | 2000 Å | 0.003 |
| Second Dielectric Layer | 10 | 1000 Å | 0.010 |
| First Dielectric Layer | 12 | 4000 Å | 0.003 |
| Second Dielectric Layer | 10 | 1000 Å | 0.010 |
| First Dielectric Layer | 6 | 2000 Å | 0.003 |
| Second Dielectric Layer | 25 | 2500 Å | 0.010 |

A number of embodiments are disclosed below for elaborating the procedures of the invention.

First Embodiment

Figure 7A:
FIGS. 7A~7F shows processes of a method of forming a pixel structure according to an embodiment.
Figure 7B:
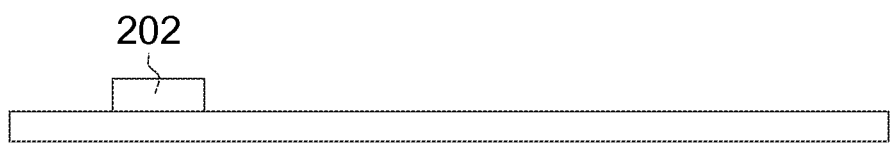
Figure 7C:
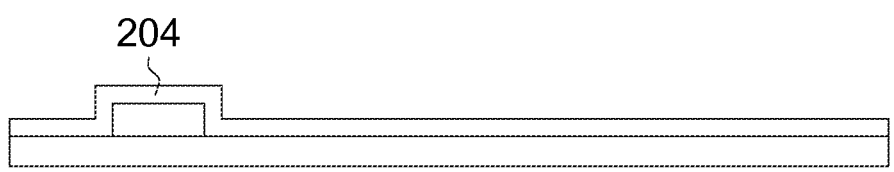
Figure 7D:
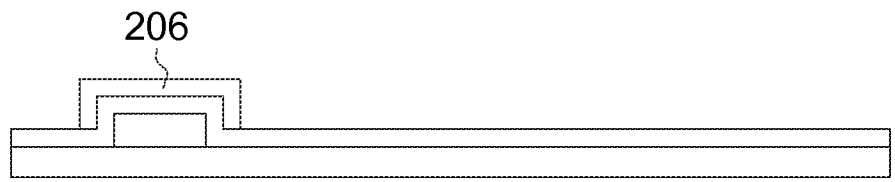
Figure 7E:
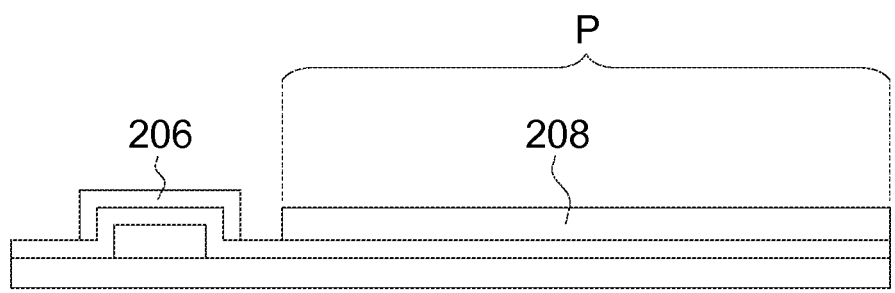
Figure 7F:
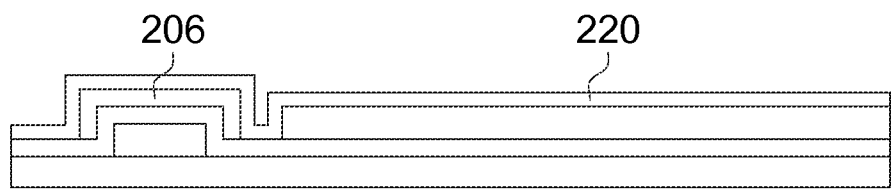
Figure 8A:
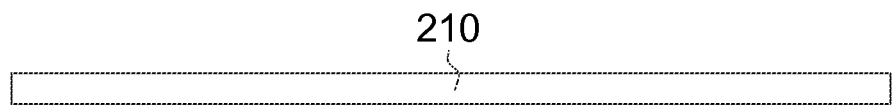
FIGS. 8A~8F shows processes of a method of forming a pixel structure according to an embodiment.
Figure 8B:
Figure 8C:
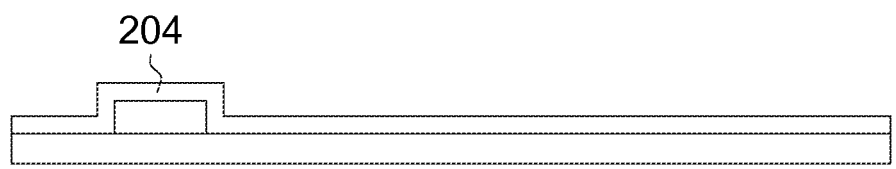
Figure 8D:
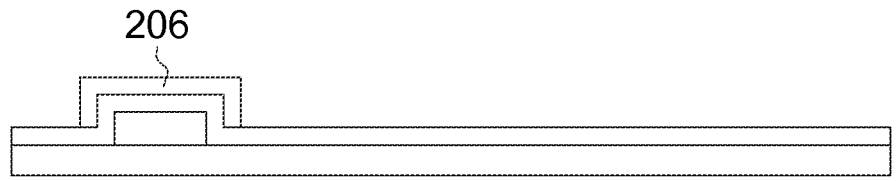
Figure 8E:
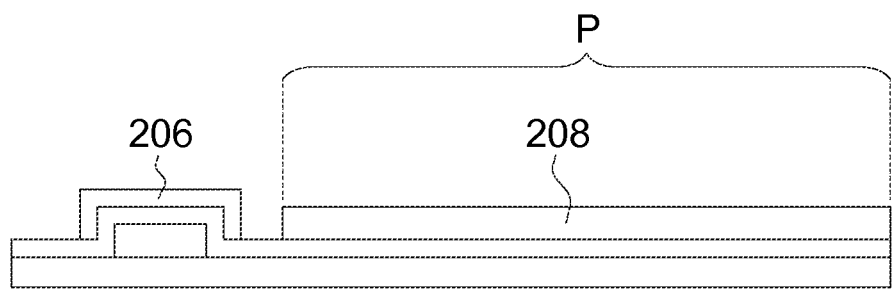
Figure 8F:
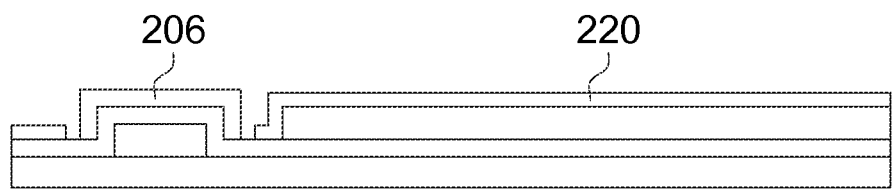

Referring to FIGS. 7A~7F, processes of a method of forming a pixel structure according to an embodiment are shown. Firstly, a signal line 202, a protection layer 204, a first dielectric layer 206, a pixel electrode 208 and a second dielectric layer 220 are sequentially formed on a substrate 210. The signal line 202, such as a data line or scan line, is located at one side of the pixel electrode 208. As indicated in FIG. 7C, the protection layer 204 covers the signal layer. As indicated in FIG. 7D, the first dielectric layer 206 covers the protection layer 204 above the signal line 202. However, in the absence of the protection layer 204, the first dielectric layer 206 may directly cover the signal line 202. The first dielectric layer 206 may be a dielectric layer with smaller permittivity or larger thickness, such that the first dielectric layer 206 has smaller capacitance, and the loading received by the signal line 202 is reduced. Referring to FIG. 7E, a pixel electrode 208 is formed within the pixel region P. Although the common electrode opposite to the pixel electrode 208 is not illustrated in the present embodiment, it still can be obtained that the common electrode is formed on the opposite substrate to form a vertical electric field between the pixel electrode 208 and the common electrode. Referring to FIG. 7F, the second dielectric layer 220 entirely covers the pixel electrode 208 and the first dielectric layer 206. In comparison to the first dielectric layer 206, the second dielectric layer 220 may be a dielectric layer with larger permittivity or smaller thickness, such that the second dielectric layer 220 has larger capacitance than the first dielectric layer 206. Therefore, the second dielectric layer 220 with larger capacitance avoids the ratio of the driving voltage (V_LC) of the liquid crystal layer to the applied voltage expresses in percentage dropping and therefore prevents voltage drop.

Second Embodiment

Referring to FIGS. 8A~8F, processes of a method of forming a pixel structure according to an embodiment are shown. The present embodiment is different from the first embodiment in that: the second dielectric layer 220 defines its coating position with a mask, such that the second dielectric layer 220 only covers the pixel electrode 208 but not the first dielectric layer 206. Based on the principles disclosed above, the first dielectric layer 206 with smaller capacitance reduces the loading received by the signal line 202, and the second dielectric layer 220 with larger capacitance avoids the ratio of the driving voltage (V_LC) of the liquid crystal layer to the applied voltage expresses in percentage dropping and therefore prevents voltage drop.

Third Embodiment

Figure 9A:
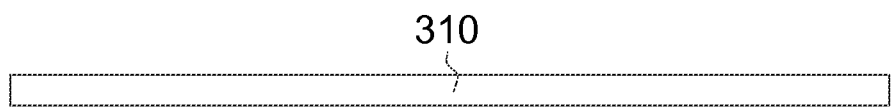
FIGS. 9A~9F shows processes of a method of forming a pixel structure according to an embodiment.
Figure 9B:
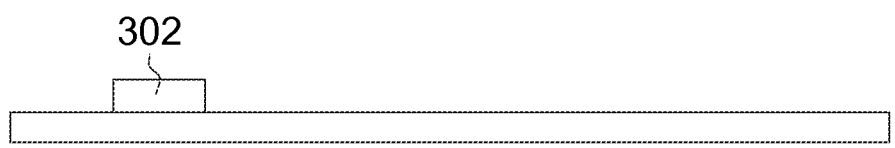
Figure 9C:
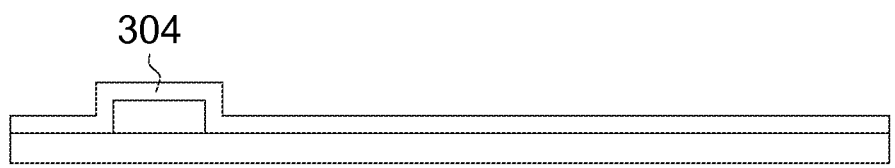
Figure 9D:
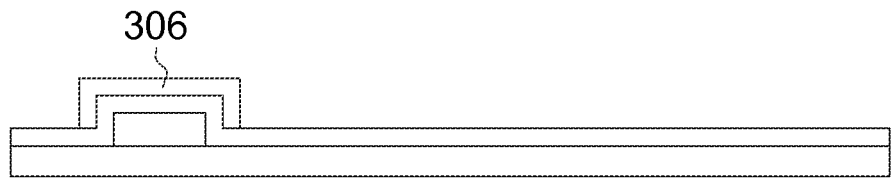
Figure 9E:
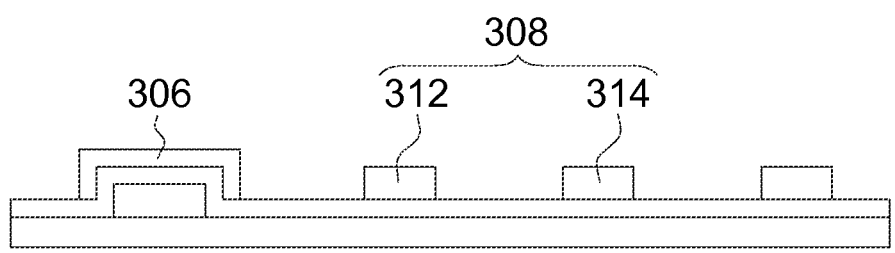
Figure 9F:
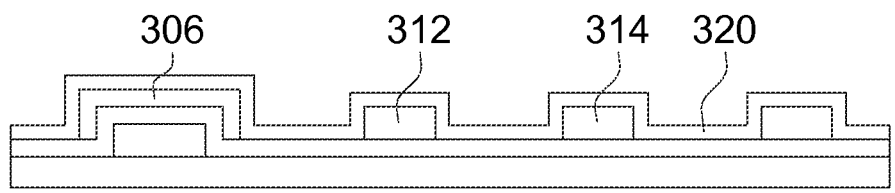
Figure 10A:
FIGS. 10A~10F shows processes of a method of forming a pixel structure according to an embodiment.
Figure 10B:
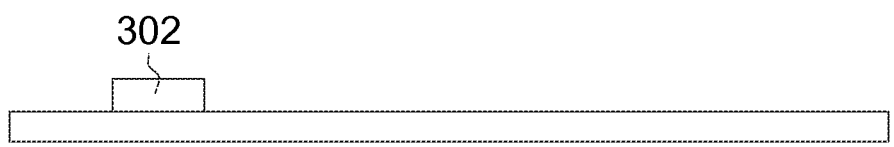
Figure 10C:
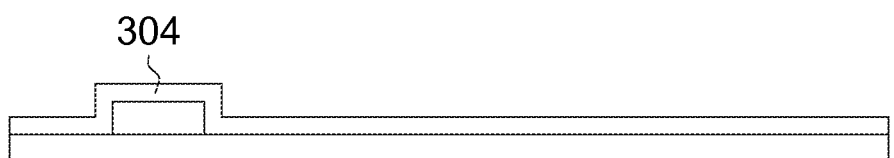
Figure 10D:
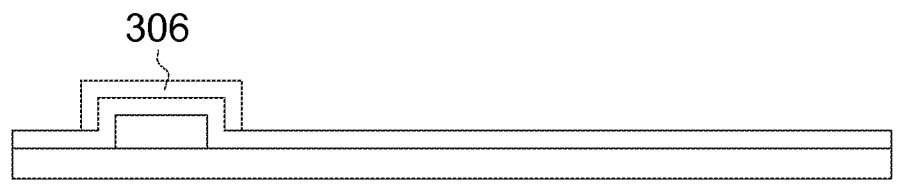
Figure 10E:
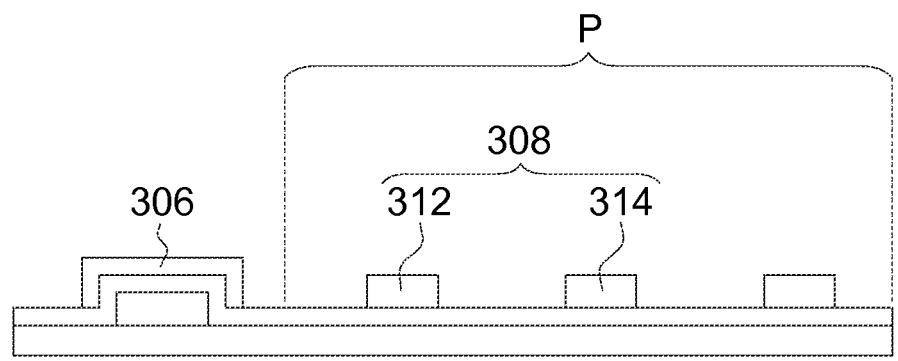
Figure 10F:
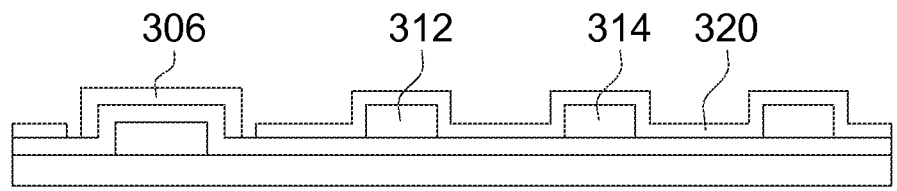

Referring to FIG. 9A~9F, processes of a method of forming a pixel structure according to an embodiment are shown. The present embodiment is different from the first embodiment in that: the pixel electrode 308 includes a first electrode 312 and a second electrode 314 which are arranged in parallel and separated from each other by an interval. The first electrode 312 and the second electrode 314 can both be pixel electrodes, or, one is a pixel electrode and the other is a common electrode. A lateral electric field is formed between the first electrode 312 and the second electrode 314 due to potential difference for controlling the liquid crystal layer. As indicated in FIG. 9D, the first dielectric layer 306 only covers the protection layer 304 above the signal line 302. As indicated in FIG. 9E, the second dielectric layer 320 entirely covers the first electrode 312, the second electrode 314 and the first dielectric layer 306. Based on the principles disclosed above, the first dielectric layer 306 with smaller capacitance reduces the loading received by the signal line 302, and the second dielectric layer 320 with larger capacitance avoids the ratio of the driving voltage (V_LC) of the liquid crystal layer to the applied voltage expresses in percentage dropping and therefore prevents voltage drop.

Fourth Embodiment

Referring to FIGS. 10A~10F, processes of a method of forming a pixel structure according to an embodiment are shown. The present embodiment is different from the third embodiment in that: the second dielectric layer 320 defines its coating position with a mask, such that the second dielectric layer 320 only covers the first electrode 312 and the second electrode 314 but not the first dielectric layer 306. Based on the principles disclosed above, the first dielectric layer 306 with smaller capacitance reduces the loading received by the signal line 302, and the second dielectric layer 320 with larger capacitance avoids the ratio of the driving voltage (V_LC) of the liquid crystal layer to the applied voltage expresses in percentage dropping and therefore prevents voltage drop.

Fifth Embodiment

Figure 11A:
FIGS. 11A~11F shows processes of a method of forming a pixel structure according to an embodiment.
Figure 11B:
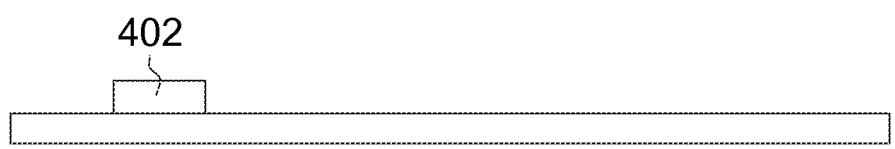
Figure 11C:
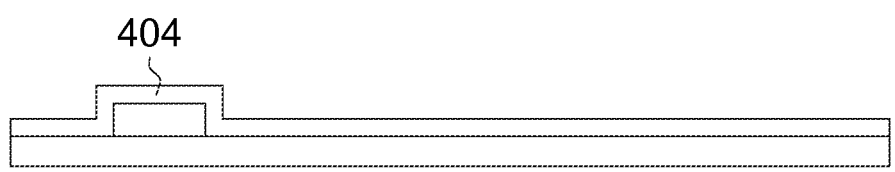
Figure 11D:
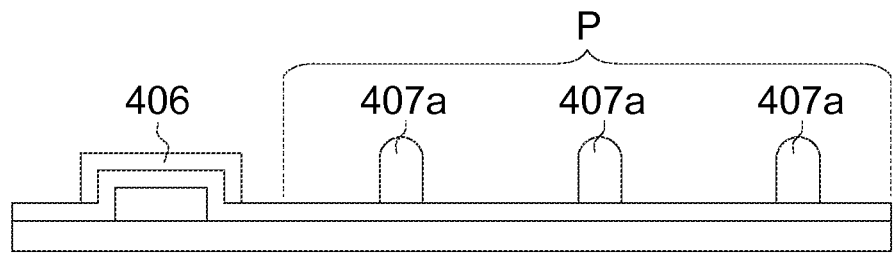
Figure 11E:
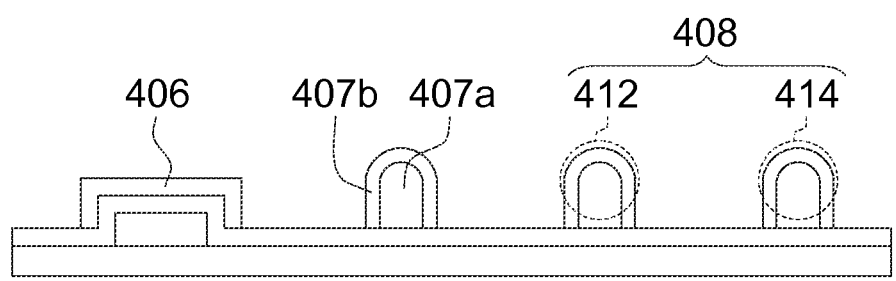

Referring to FIGS. 11A~11F, processes of a method of forming a pixel structure according to an embodiment are shown. Firstly, a signal line 402, a protection layer 404, a first dielectric layer 406, a pixel electrode 408 and a second dielectric layer 420 are sequentially formed on the substrate 410. The present embodiment is different from the third embodiment in that: the first dielectric layer 406 further includes a plurality of protrusions 407a formed on pixel region P as indicated in FIG. 11D, and, the pixel electrode 408 includes a transparent conductive layer 407b formed on each protrusions 407a to form a first electrode 412 and a second electrode 414 which are separated from each other by an interval as indicated in FIG. 11E. The first electrode 412 and the second electrode 414 both are pixel electrodes, or, one is a pixel electrode and the other is a common electrode. A lateral electric field is formed between the first electrode 412 and the second electrode 414 due to the difference in electrical potentials for controlling the liquid crystal layer. Through the protrusions 407a, the lateral electric field formed between the first electrode 412 and the second electrode 414 may cover a wider range, and the birefringence of the liquid crystal layer can thus be improved.

Figure 11F:
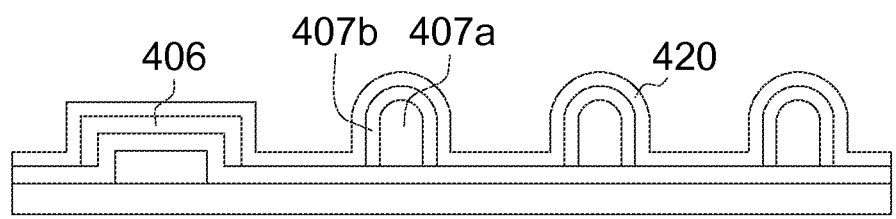
Figure 12A:
FIGS. 12A~12F shows processes of a method of forming a pixel structure according to an embodiment.
Figure 12B:
Figure 12C:
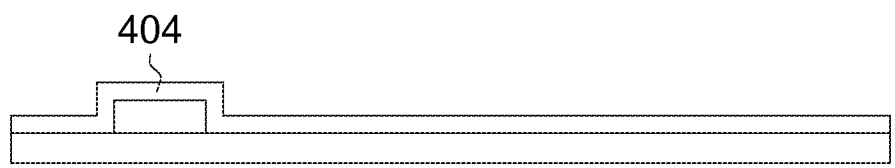
Figure 12D:
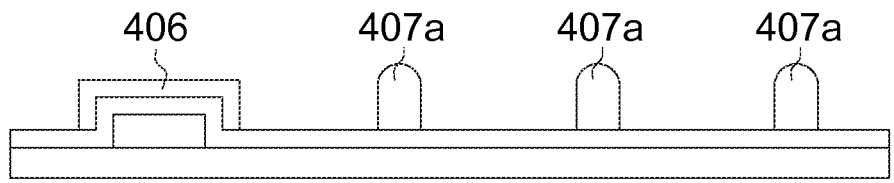
Figure 12E:
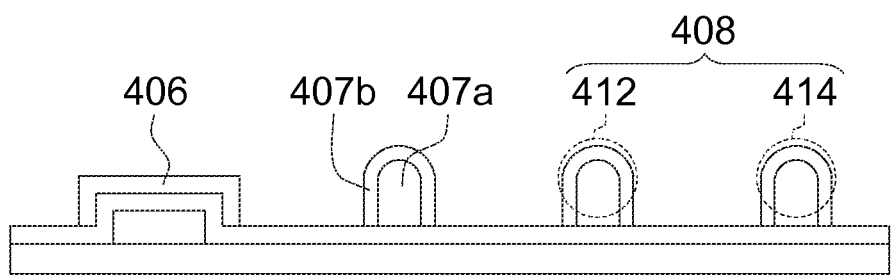
Figure 12F:
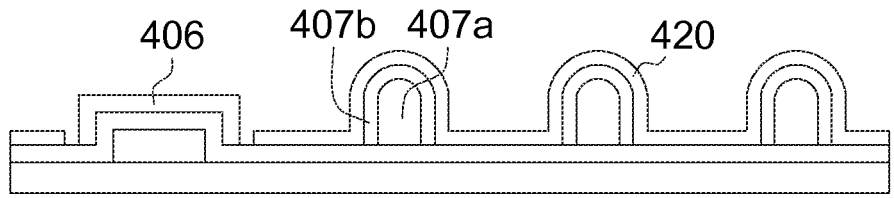

As indicated in FIG. 11D, the first dielectric layer 406 only covers the protection layer 404 above the signal line 402. As indicated in FIG. 11F, the second dielectric layer 420 entirely covers the first electrode 412, the second electrode 414 and the first dielectric layer 406. Based on the principles disclosed above, the first dielectric layer 406 with smaller capacitance reduces the loading received by the signal line 402, and the second dielectric layer 420 with larger capacitance avoids the ratio of the driving voltage (V_LC) of the liquid crystal layer to the applied voltage expresses in percentage dropping and therefore prevents voltage drop.

Sixth Embodiment

Referring to FIG. 12A~12F, processes of a method of forming a pixel structure according to an embodiment are shown. The present embodiment is different from the fifth embodiment in that: the second dielectric layer 420 defines its coating position with a mask, such that the second dielectric layer 420 only covers the first electrode 412 and the second electrode 414 but not the first dielectric layer 406. Based on the principles disclosed above, the first dielectric layer 406 with smaller capacitance reduces the loading received by the signal line 402, and the second dielectric layer 420 with larger capacitance avoids the ratio of the driving voltage (V_LC) of the liquid crystal layer to the applied voltage expresses in percentage dropping and therefore prevents voltage drop.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pixel structure substrate, comprising:
a substrate on which a data line and a first electrode are disposed;
a first dielectric layer directly covering the data line; and
a second dielectric layer disposed on the substrate, wherein the second dielectric layer covers the first electrode and the first dielectric layer;
wherein a thickness of the second dielectric layer is smaller than a thickness of the first dielectric layer, and satisfying the following equation $$u1*A1/d1<u2*A2/d2,$$

wherein A1 denotes an area of the first dielectric layer overlapping the data line, d1 denotes the thickness of the first dielectric layer and u1 denotes a permittivity of the first dielectric layer, A2 denotes an area of the second dielectric layer overlapping the first electrode, d2 denotes the thickness of the second dielectric layer and u2 denotes a permittivity of the second dielectric layer.

2. The pixel structure substrate according to claim 1, wherein the permittivity of the second dielectric layer is less than 6.4, and the thickness of the second dielectric layer is less than 1000 angstroms.

3. The pixel structure substrate according to claim 1, wherein a material of the second dielectric layer comprises silicide, oxide or polymer.

4. The pixel structure substrate according to claim 1, further comprising a second electrode disposed on the substrate and adjacent to the first electrode, wherein the second dielectric layer covers the first electrode, the second electrode, and the first dielectric layer.

5. The pixel structure substrate according to claim 4, wherein the first electrode and the second electrode are pixel electrodes.

6. The pixel structure substrate according to claim 4, wherein the first electrode is a pixel electrode, and the second electrode is a common electrode.

7. The pixel structure substrate according to claim 1, further comprising a scan line disposed on the substrate and covered by the first dielectric layer, wherein the second dielectric layer covers the first electrode, the data line, the scan line, and the first dielectric layer.

8. The pixel structure substrate according to claim 1, wherein a material of the first dielectric layer comprises silicide, oxide or polymer.

9. The pixel structure substrate according to claim 1, further comprising a second electrode disposed under the first electrode, and the first electrode and the second electrode are separated by an insulation layer.

10. The pixel structure substrate according to claim 9, wherein the first electrode is a pixel electrode and the second electrode is a common electrode.

11. A liquid crystal display structure, comprising:
a substrate on which a data line and a first electrode are disposed;
a first dielectric layer directly covering the data line;
a second dielectric layer disposed on the substrate, wherein the second dielectric layer covers the first electrode and the first dielectric layer,
wherein a thickness of the second dielectric layer is smaller than a thickness of the first dielectric layer, and satisfying the following equation $$u1*A1/d1<u2*A2/d2,$$

wherein A1 denotes an area of the first dielectric layer overlapping the data line, d1 denotes the thickness of the first dielectric layer and u1 denotes a permittivity of the first dielectric layer, A2 denotes an area of the second dielectric layer overlapping the first electrode, d2 denotes the thickness of the second dielectric layer and u2 denotes permittivity of the second dielectric layer,
an opposite substrate parallel and opposite to the substrate; and
a liquid crystal layer disposed between the substrate and the opposite substrate.

12. The liquid crystal display structure according to claim 11, wherein the permittivity of the second dielectric layer is less than 6.4, and the thickness of the second dielectric layer is less than 1000 angstroms.

13. The liquid crystal display structure according to claim 11, wherein a material of the second dielectric layer comprises silicide, oxide or polymer.

14. The liquid crystal display structure according to claim 11, further comprising a second electrode disposed on the substrate and adjacent to the first electrode, wherein the second dielectric layer covers the first electrode, the second electrode, and the first dielectric layer.

15. The liquid crystal display structure according to claim 14, wherein the first electrode and the second electrode are pixel electrodes.

16. The liquid crystal display structure according to claim 14, wherein the first electrode is a pixel electrode, and the second electrode is a common electrode.

17. The liquid crystal display structure according to claim 11, further comprising a scan line disposed on the substrate and covered by the first dielectric layer, wherein the second dielectric layer covers the first electrode, the data line, the scan line, and the first dielectric layer.

18. The liquid crystal display structure according to claim 11, wherein a material of the first dielectric layer comprises silicide, oxide or polymer.

19. The liquid crystal display structure according to claim 11, further comprising a second electrode disposed under the first electrode, and the first electrode and the second electrode are separated by an insulation layer.

20. The liquid crystal display structure according to claim 19, wherein the first electrode is a pixel electrode and the second electrode is a common electrode.

* * * * *